(12) United States Patent
Weed et al.

(10) Patent No.: US 6,914,251 B1
(45) Date of Patent: Jul. 5, 2005

(54) ALIGNMENT STRUCTURE AND METHOD FOR MATING A WAFER DELIVERY DEVICE TO A WAFER TREATMENT TOOL

(75) Inventors: Steven D. Weed, Boston, MA (US); Allan D. Weed, Marblehead, MA (US)

(73) Assignee: Axcelis Technologies, Inc., Beverly, MA (US)

(*) Notice: Subject to any disclaimer, the term of this patent is extended or adjusted under 35 U.S.C. 154(b) by 109 days.

(21) Appl. No.: 10/383,410

(22) Filed: Mar. 7, 2003

(51) Int. Cl.[7] .......................... G01J 1/00; G01N 21/00; G01N 23/00; B65G 0/00; B65G 65/34
(52) U.S. Cl. .................... 250/491.1; 414/217; 414/416; 414/937; 414/940
(58) Field of Search ........................ 250/491.1, 442.11, 250/492.21, 492.3; 414/217, 939, 416, 940, 217.1

(56) References Cited

U.S. PATENT DOCUMENTS

| | | | | |
|---|---|---|---|---|
| 4,449,885 A | * | 5/1984 | Hertel et al. ........... 414/416.08 |
| 5,828,070 A | * | 10/1998 | Brailove et al. ......... 250/443.1 |
| 6,053,688 A | * | 4/2000 | Cheng .................. 414/416.03 |

* cited by examiner

*Primary Examiner*—John R. Lee
*Assistant Examiner*—Kalimah Fernandez
(74) *Attorney, Agent, or Firm*—Watts Hoffmann Co., LPA

(57) ABSTRACT

Apparatus and method for placement of workpieces such as silicon wafers in relation to an integrated circuit fabrication tool. A robotic arm mounted in relation to the tool moves workpieces in and out of the tool. A spacer has an exposed spacer surface facing away from the tool. The relative position of this exposed spacer surface is adjustable with respect to the tool. A movable cassette support supports one or more workpieces and is placed in abutting relationship with the spacer surface. It is onto this cassette support surface that a conveyor system such as an overhead transport delivers cassettes containing workpieces such as wafers for subsequent treatment by the tool.

16 Claims, 7 Drawing Sheets

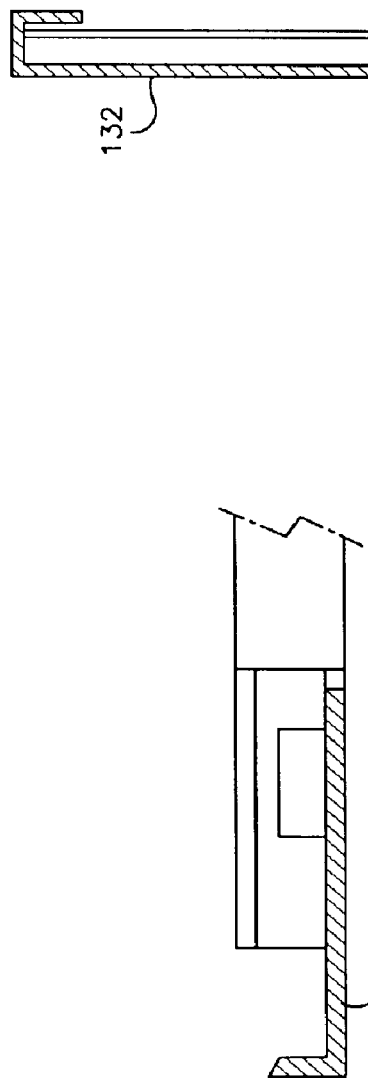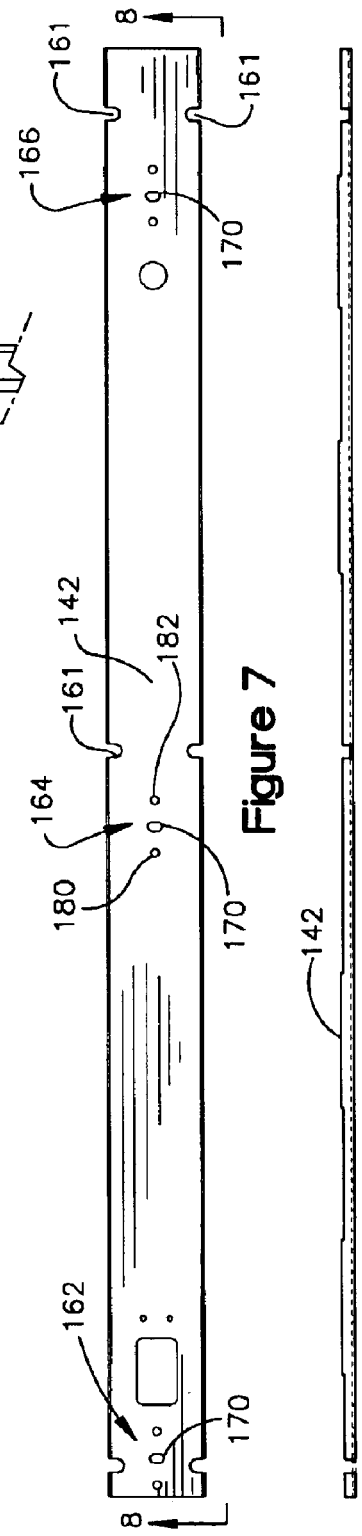

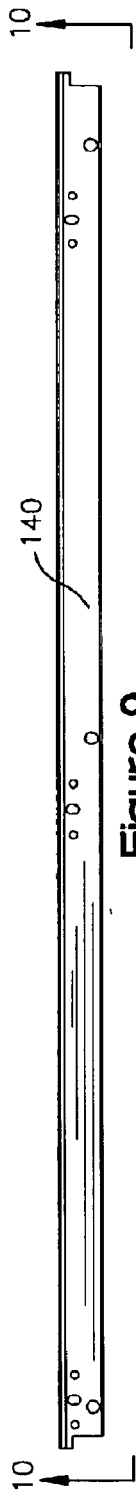
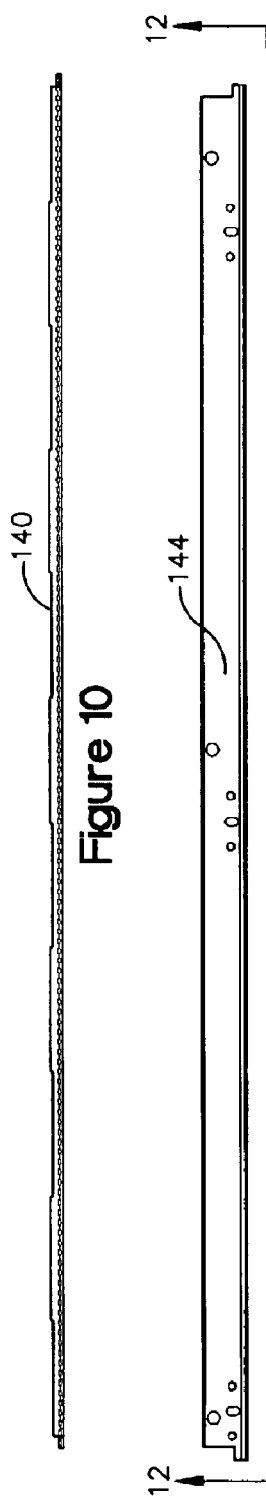
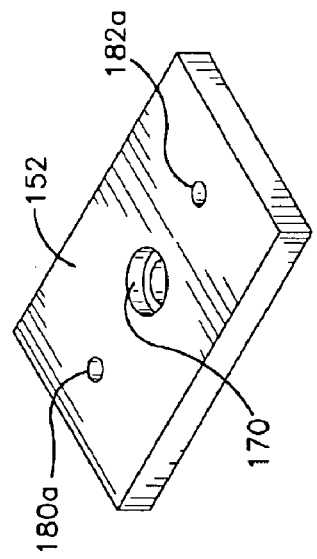
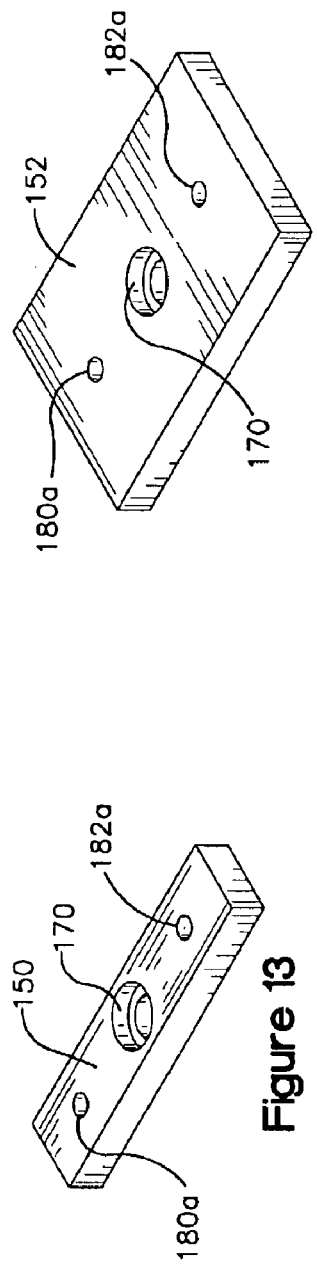

US 6,914,251 B1

ALIGNMENT STRUCTURE AND METHOD FOR MATING A WAFER DELIVERY DEVICE TO A WAFER TREATMENT TOOL

FIELD OF THE INVENTION

The present invention concerns method and apparatus for aligning a workpiece support in relation to a tool for fabricating integrated circuits.

BACKGROUND ART

Axcelis Technologies, assignee of the present invention, sells products for treatment of silicon wafers during IC fabrication. One such product or tool is sold under the designation HE-3. This tool creates an ion beam that modifies the physical properties of wafers that are placed into the ion beam. This process can be used, for example, to dope the silicon from which the untreated wafer is made to produce a semiconductor material. Controlled use of masking with resist materials prior to ion implantation as well as layering of different dopant patterns within the wafer produce an integrated circuit for use in one of a myriad of applications.

A variety of other tools are used during integrated circuit fabrication. These tools include rapid thermal processing of wafers under controlled conditions to anneal the wafers. Other tools are used to apply photoresist in controlled patterns onto the wafers. Tools are used to remove photoresist materials from the wafers during an ashing process. Other tools are used to cut the treated wafers into individual integrated circuits.

An ion implantation chamber of an ion beam implanter such as a model HE-3 implanter is maintained at reduced pressure. Subsequent to acceleration along a beam line, the ions in the beam enter the implantation chamber and strike the wafer. In order to position the wafer within the ion implantation chamber, they are moved by a robot into a load lock from a cassette or storage device delivered to the implanter by a conveyor system.

Front opening unified pods have become a popular mechanism for moving silicon wafers from one workstation to another in an integrated circuit (IC) fabrication facility. Different versions of these pods are commercially available from different manufacturers including Asyst Technologies and Brooks Automation. Use of such pods has resulted in a need to automatically deliver the pods to a position in relation to tools used in treating the silicon wafers during integrated circuit fabrication.

A front opening unified pod (or FOUP) containing a number of stacked wafers is delivered from one tool to a next subsequent tool by an automated delivery device such as an overhead transport. The overhead transport deposits the pod to a location within the reach of a robot so that a robotic arm can extract one or more silicon wafers from the pod for treatment. The present invention concerns a means of mating a wafer delivery device to a wafer treatment tool such as an ion implanter in a precise way.

SUMMARY OF THE INVENTION

Apparatus constructed with one embodiment of the invention has structure for placement of workpieces in relation to an integrated circuit fabrication tool. In one typical application the workpieces are silicon wafers used in fabricating integrated circuits. A robotic arm mounted in relation to the tool moves workpieces in and out of the tool. A spacer has an exposed spacer surface facing away from the tool. The relative position of this exposed spacer surface is adjustable with respect to the tool. A movable cassette support supports one or more workpieces and is placed in abutting relationship with the spacer surface. It is onto this cassette support surface that a conveyor system such as an overhead transport delivers wafers or the like for subsequent treatment by the tool.

Use of the spacer allows a conveyor system such as an overhead conveyor system to accurately deliver a pod or cassette storage device to the tool for treatment or workpieces carried by the pod. Use of a spacer also allows the tool to interface with a number of pod door opener designs from a number of different manufacturers. These and other objects, advantages and features of the invention will become better understood from a detailed description of an exemplary embodiment of the invention, which is described in conjunction with the accompanying drawings.

BRIEF DESCRIPTION OF THE DRAWINGS

FIG. 5 is a view of the FIG. 4 spacer member as seen from the plane 5—5 of FIG. 4;

FIG. 6 is a view of the FIG. 4 spacer member as seen from the plane 6—6 of FIG. 4;

FIG. 7 is a plan view of a first elongated member that is welded to a front piece of the spacer member seen in FIGS. 3 and 4;

FIG. 8 is a view of the first elongated member as seen from the plane 8—8 of FIG. 7;

FIG. 9 is a plan view of a second elongated member that is welded to a front piece of the spacer member seen in FIGS. 3 and 4;

FIG. 10 is a view of the second elongated member depicted in FIG. 9 as seen from the plane 10—10 of FIG. 9;

FIG. 11 is a plan view of a third elongated member that is welded to a front piece of the spacer member seen in FIGS. 3 and 4;

FIG. 12 is a view of the third elongated member depicted in FIG. 11 as seen from the plane 12—12 of FIG. 11;

FIG. 13 is a perspective view of a first spacer block that is interposed between the front piece of the spacer member and the elongated members depicted in FIGS. 9 and 11;

FIG. 14 is a perspective view of a second spacer block that is interposed between the front piece of the spacer member and the elongated members depicted in FIG. 7;

EXEMPLARY MODE FOR PRACTICING THE INVENTION

Figure 1:
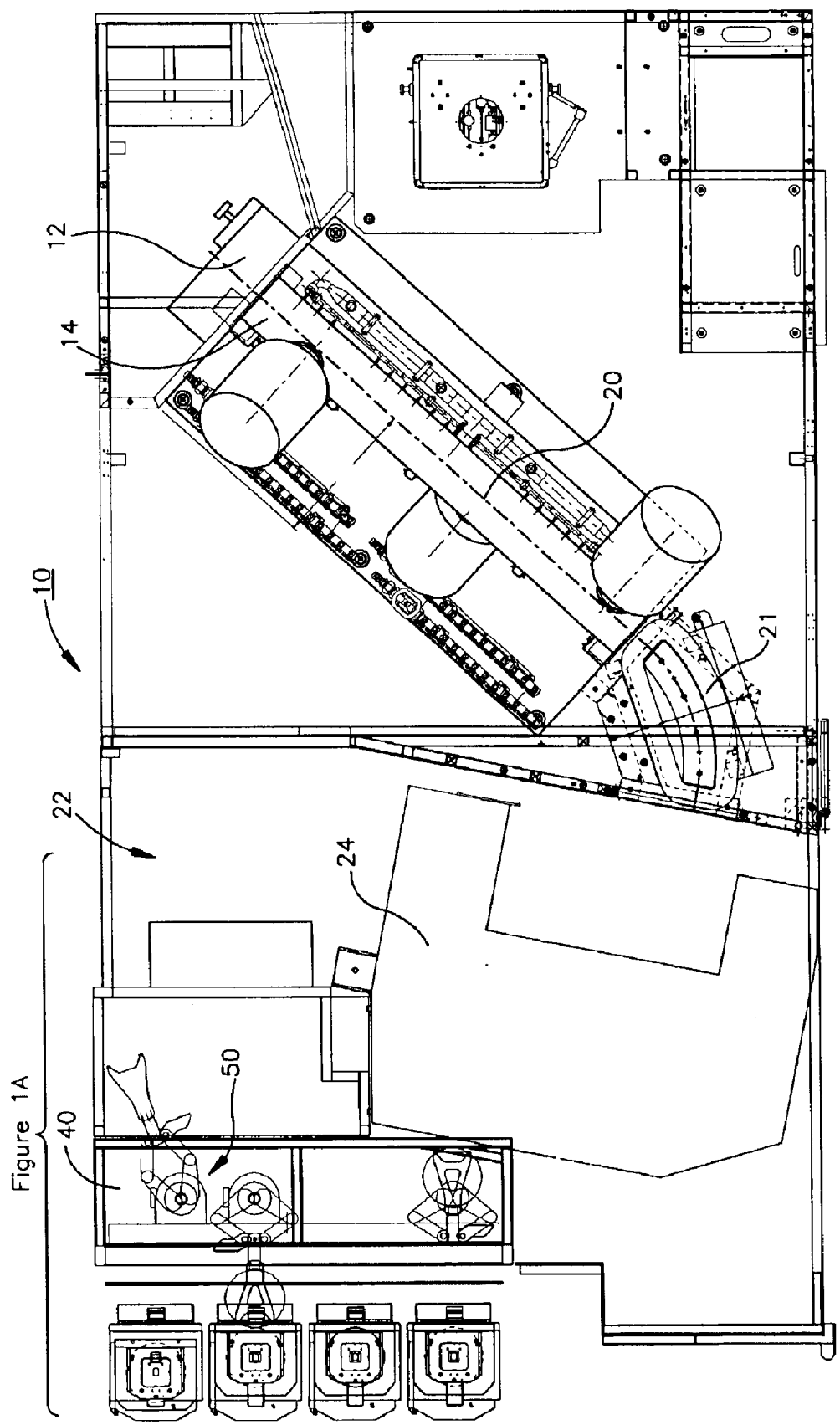
FIG. 1 is overview depiction of an ion implanter illustrating one application for the present invention.

Turning now to the drawings, FIG. 1 is an overview depiction of an ion implanter 10. Axcelis Technologies, assignee of the present invention, sells such an implanter, designated HE-3, for ion beam treatment of silicon wafers during integrated circuit fabrication. While an exemplary embodiment of the invention is depicted for use with an ion implanter, the invention has utility with any tool used to treat a workpiece in fabricating an integrated circuit.

The ion implanter 10 includes an ion source 12 for injecting ions into an evacuated region 14 of the implanter. The source 12 emits ions of a chosen type (based on the source material ionized in the source) for a particular application. The ions are charged particles and due to their charge can be accelerated through the evacuated region 14. As they are accelerated, they are also maintained in the form of an ion beam 20. Ions that make up the beam 20 enter a magnet 21, which bends the beam 20 causing it to reach an implantation end station 22.

An average ion within the beam has a particular target energy that is controlled for different ion implantation applications. When the ion beam impinges on a workpiece (typically a silicon wafer) positioned in an implantation chamber 24 the ions that make up the beam that strike the workpiece are implanted into the workpiece. The ion implanter of FIG. 1 can be used to implant silicon wafers to produce a semiconductor material in an implanted region of the wafer. Controlled use of masking with resist materials prior to ion implantation as well as layering of different dopant patterns within the wafer produce an integrated circuit for use in one of a myriad of applications.

The ion implantation chamber 24 of an ion beam implanter such as a model HE-3 implanter is maintained at reduced pressure. In order to position the wafer within the ion implantation chamber, wafers are moved into a load lock (not shown). The load lock accepts wafers from a robot 50 having a robotic arm, which moves wafers into an out of the load lock. From the load lock the wafers are moved by another robot (not shown) onto a support, which is moved into and out of the implantation chamber 24. In accordance with a present HE-3 implanter design the wafers are supported on a spinning disk support (not shown) that is tilted up into the path of the ion beam 20 and rotates the wafers through the beam 20.

Figure 1A:
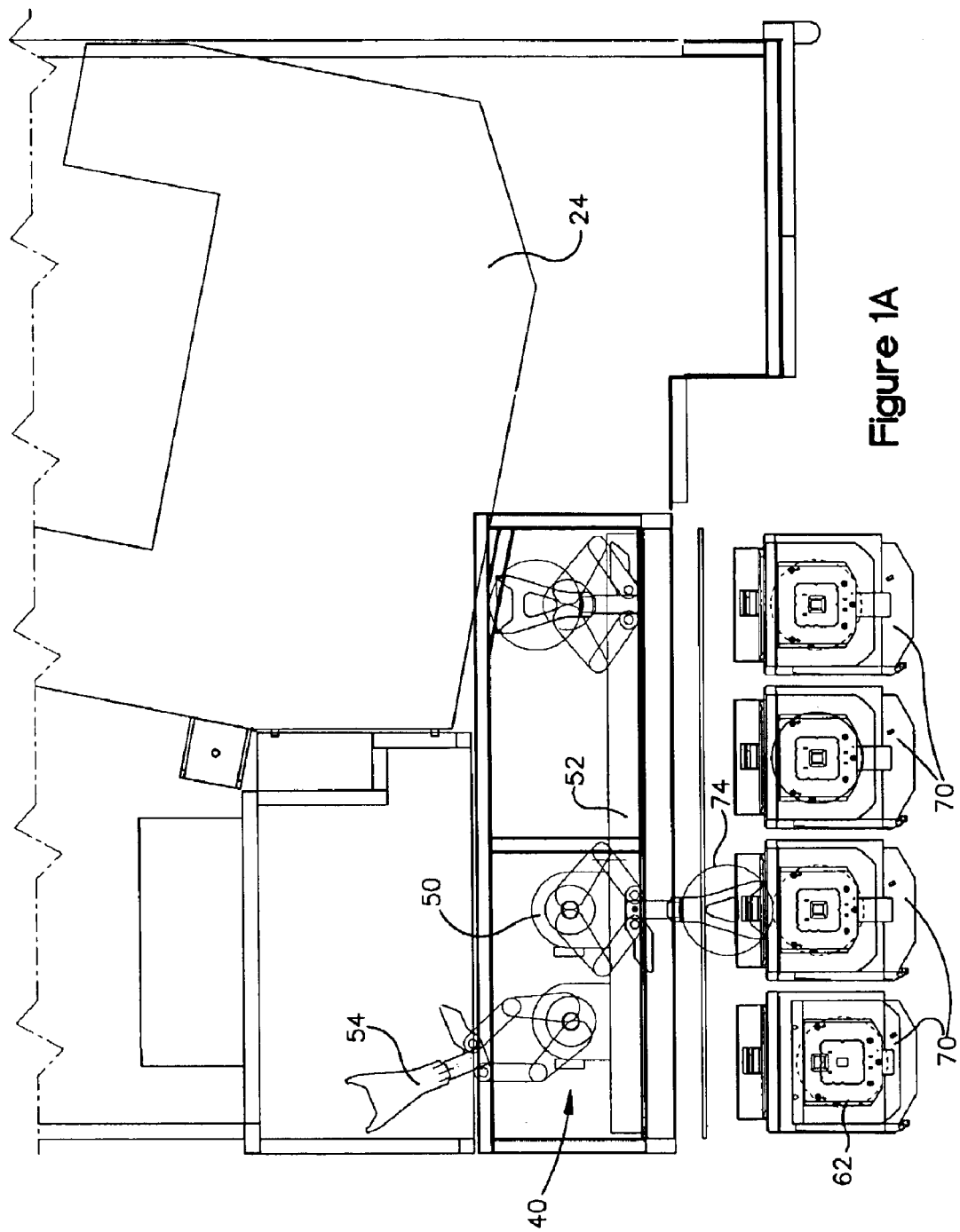
FIG. 1A is an enlarged overhead depiction of an implanter endstation that treats workpieces such as silicon wafers in an evacuated implantation chamber.

The robot 50 that transfers wafers into and out of the load lock is positioned with respect to the implanter 10 in a region 40 of atmospheric pressure. The robot 50 moves back and forth on a track 52 (FIG. 1A) in a generally linear travel path. In the exemplary embodiment of the invention shown in the figures, the robot 50 is mounted within an enclosure formed by a number of frame members 60 (FIG. 2) that bound the region 40 through which the robot 50 moves. The frame members 60 serve as a rigid support for the robot 50 and the robot track 52 as the robot gathers wafers from one or more front loading unified pods or cassettes 62.

Figure 2:
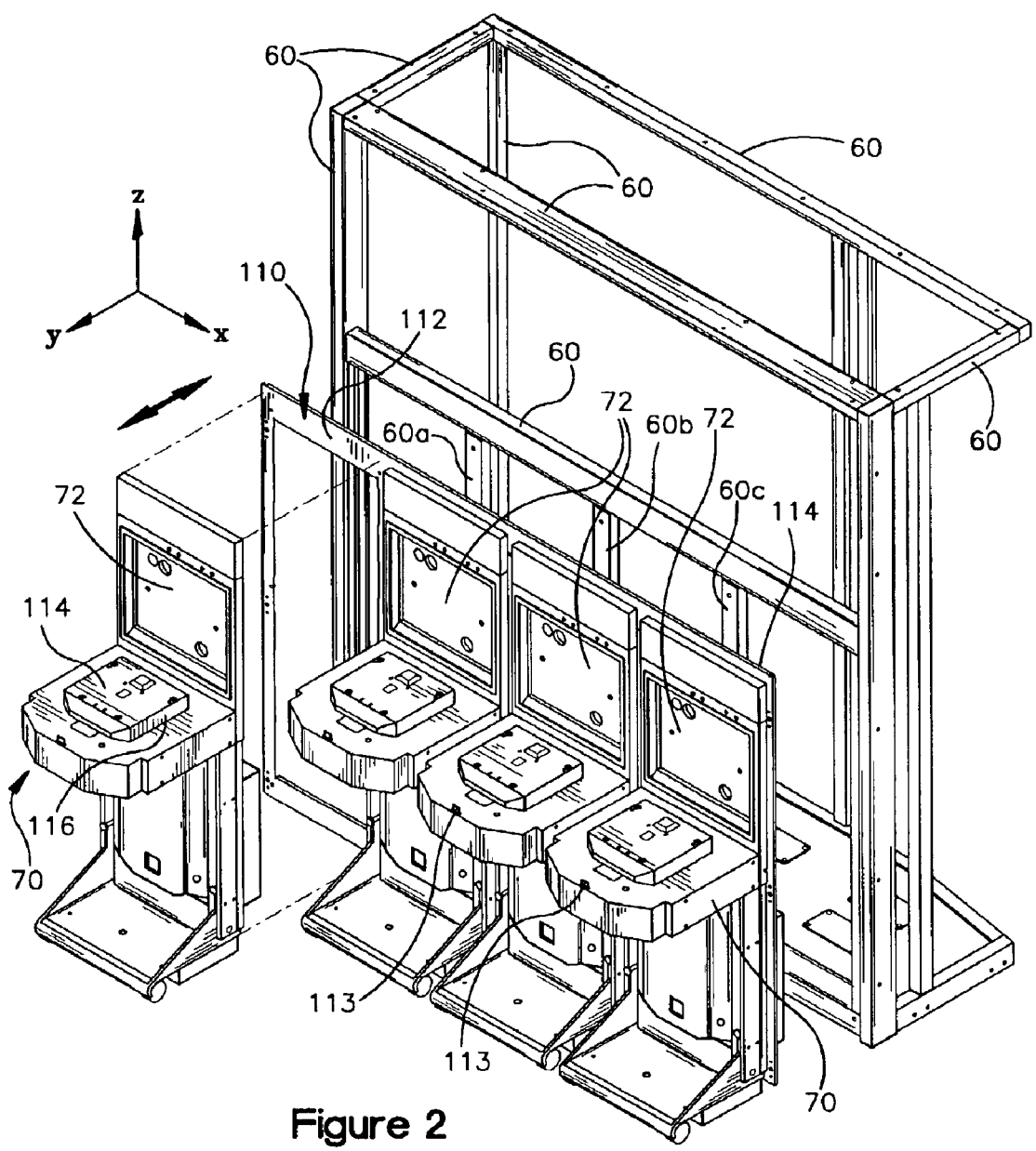
FIG. 2 is a perspective view of an ion implanter frame, four pod door openers, and a spacer member that aids in allowing wafers to be delivered to the ion implanter endstation of FIG. 1A.

Turning to FIG. 2, four such front loading unified pods 62 can be positioned outside the ion implanter in relation to multiple pod door openers 70. The exemplary embodiment of the invention illustrated in the drawings includes four such pod door openers 70. These door openers 70 are commercially available from Asyst or Brooks Automation.

The robot 50 has a robotic arm 54 for moving workpieces such as silicon wafers 74 into and out of the implanter 10 by means of doors 72 that open and close to allow access to the wafers supported within the pods 62.

As seen in FIG. 2, the ion implanter 10 also includes an intermediate frame or spacer member 110 having an exposed spacer surface 112 facing away from the implanter 10. During installation of the ion implanter within a fabrication facility the pod door openers 70 are coupled to the implanter by bringing them into abutting relationship with the surface 112 and attaching them to the spacer member 110. As described more completely below, the position of the exposed spacer surface 112 is movable with respect to the ion implanter 10 so that the position of the exposed spacer surface 112 can be adjusted. When moved into abutting relationship with the spacer member 110, the pod door openers 70 are precisely positioned with respect to an overhead transport that delivers wafers to the implanter 10. Since the position of the surface 112 can be adjusted the position of the four pod door openers 70 can be adjusted to accurately position those pod door openers. Each of the pod door openers includes one or more locating pins 113 that are used by the overhead conveyer in locating precisely where to position the pods or cassettes 62. In some systems this locating is done by an optical sensing system that uses a laser beam to locate a pin 113. Present wafer transport systems require the pin 113 to be positioned within +/−3 millimeters of a nominal position for the pods to be delivered.

The four pod door openers 70 can each support an associated front loading unified pod 62 on a generally flat moveable support surface 114. The front loading unified pod 62 in turn supports one or more parallel oriented workpieces such as silicon wafers 74. Once the pod 62 has been placed on the support surface 114, the pod door opener moves the pod forward and opens the doors 72 to bring the cassette or pod into position for removal of the wafers within the cassette. By positioning the wafer pod in a know position with respect to the outwardly facing spacer surface 112 the robot arm 54 can accurately move the wafers into and out of the pod as they are treated by the implanter.

Figure 3:
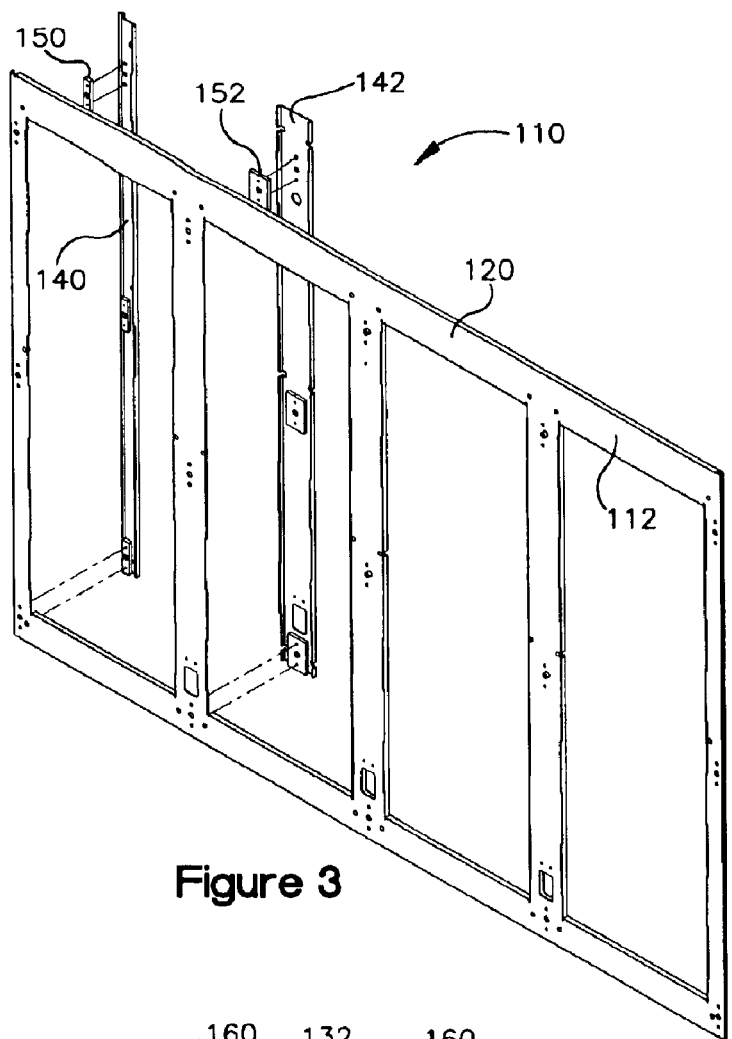
FIG. 3 is a partially exploded perspective view of a spacer member used in positioning a wafer support in the region of the ion implanter.

FIGS. 3–16 more clearly depict the spacer member 110. As depicted in the exploded perspective view of FIG. 3, the spacer member 110 is a weldment made up of multiple metal pieces (such as steel parts that are machined or stamped) that are welded together to form the spacer member. A front piece 120 of the weldment seen in the plan view of FIG. 4 defines five upright pieces 122, 124, 126, 128, 130 spaced apart by elongated generally rectangular openings and connected at the top and bottom by two cross pieces 132, 134. Welded to the front piece 120 are five upright pieces that in combination with thickening blocks define a thickness T of the spacer member 110. At seen in the perspective view of FIG. 3, the weldment of the spacer member 110 includes a left upright 140 depicted in the plan view of FIG. 9. The weldment also includes three interior uprights 142 that are depicted in the plan view of FIG. 7. A right upright 144 is depicted in the plan view of FIG. 11. Each of the uprights 140, 142, 144 is spaced from the front piece 120 by spacer blocks 150, 152. A first spacer block 150 fits between the side upright pieces 122, 130 of the front piece 120 and the right and left uprights 140, 144. A wider spacer block 152 fits between the interior uprights 142 and the interior pieces 124, 126, 128 of the front piece 120.

Figure 4:
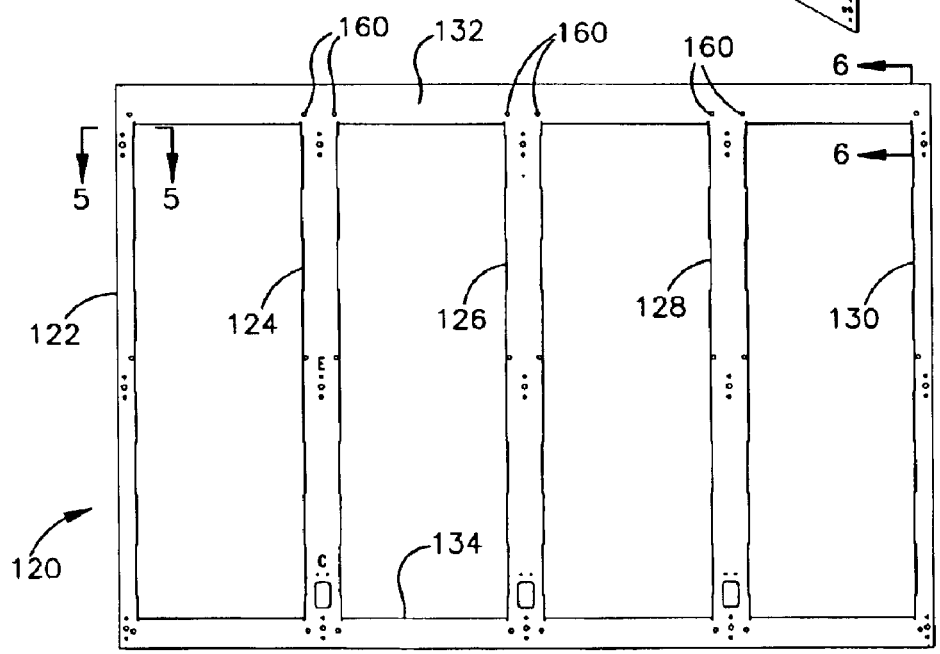
FIG. 4 is a front plan view of the spacer member of FIG. 3.
Figure 15:
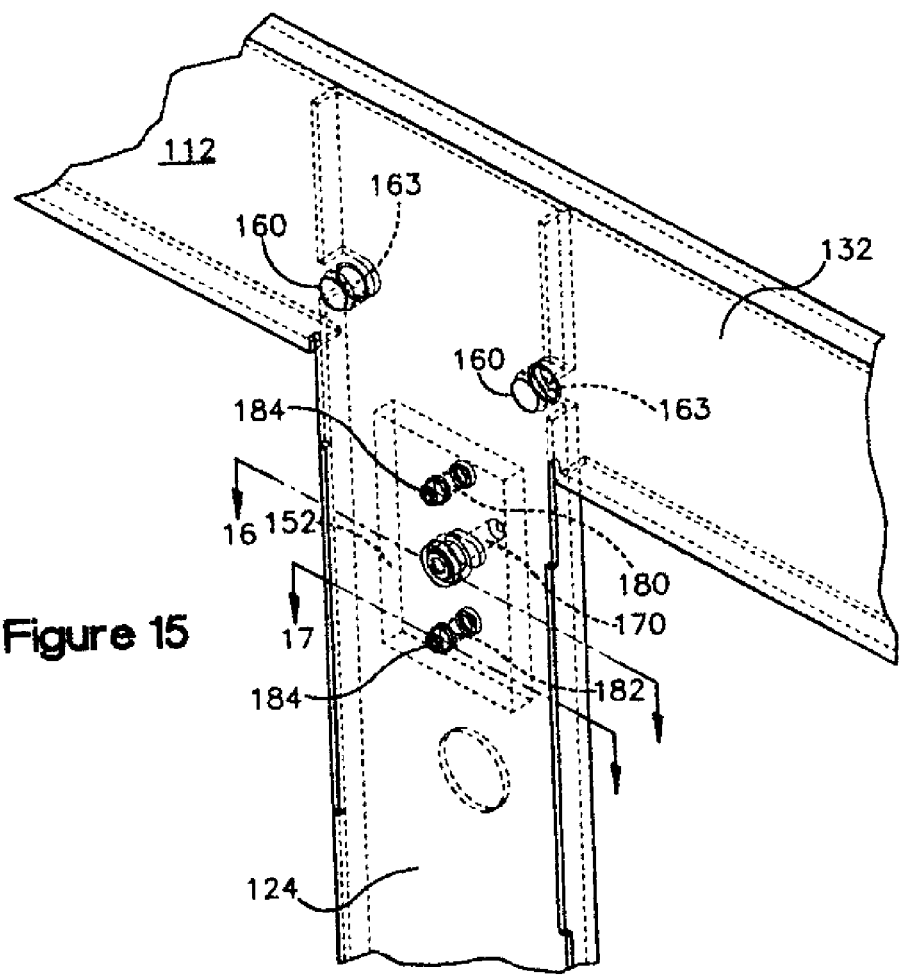
FIG. 15 is an enlarged perspective view of a spacer member showing a region of one of the elongated members welded to the front piece to form a weldment.
Figure 16:
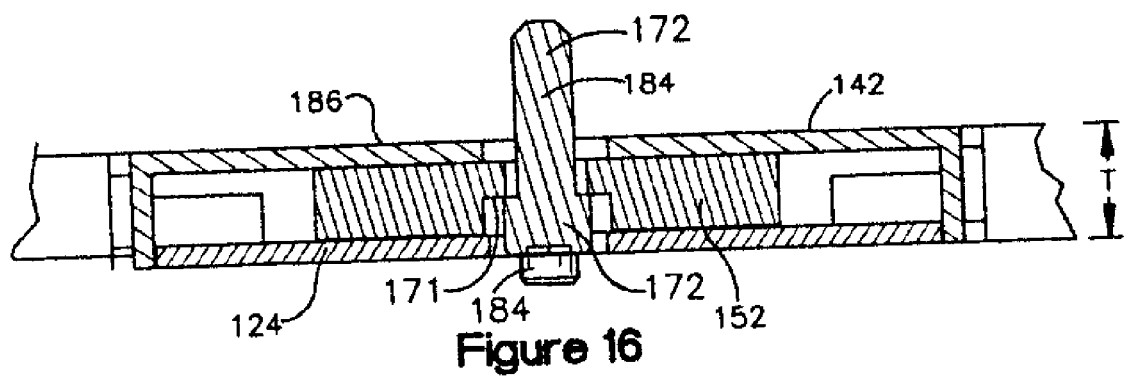
FIG. 16 is a section view of a region of the weldment depicted in FIG. 15 as seen from the plane 16—16 in FIG. 15.
Figure 17:
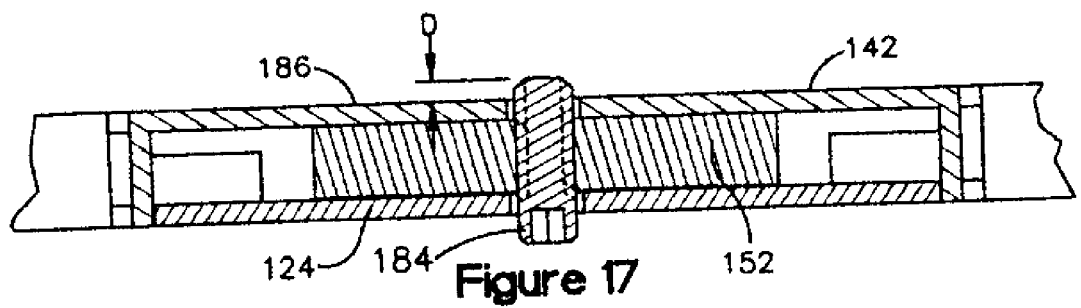
FIG. 17 is a section view of a region of the weldment depicted in FIG. 15 as seen from the plane 17—17 in FIG. 15.

FIGS. 15 and 16 depict a manner in which the weldment allows the front surface 112 of the spacer member 110 to be adjusted in relation to the rest of the ion implanter's end station. As seen in FIGS. 4 and 15, a front surface of the front piece 120 include openings 160 at regular intervals. In the region of these openings 160 the uprights 142 have notches 161, which accommodate threaded inserts 163 welded to the spacer member. These openings 160 allow connectors (not shown) to attach the pod door openers 70 to the weldment of the spacer member 110 by threaded engagement with the inserts 163. As seen in FIG. 7, the uprights 142 have three spaced apart hole patterns; one pattern 162, a second pattern 164, and a third pattern 166. A center hole 170 having a step 171 at each of these three patterns 162, 164, 166 accommodates a threaded connector 172 for attaching the weldment securely to the frame members 60 of the end station. As seen in FIG. 2, each of three upright frame members 60a, 60b, 60c has a threaded opening in the region of the hole pattern 162 facing the weldment. Other openings are located along the frame members 60a, 60b, 60c in relation to the hole patterns 164, 166.

The threaded connector 172 has an enlarged head that engages the step 171 and a elongated portion that passes through the openings 170 and threads into openings in the frame members 60 including the frame members 60a, 60b, 60c. When securely tightened, the weldment of the spacer member 110 is securely positioned with respect to the ion implanter and is ready for attachment of the pod door openers by means of the connectors that pass through the openings 160 to engage the inserts 163.

The ion implanter 10 is installed at a precise position with respect to an overhead cassette conveyor that moves cassettes or pods from one workstation to the next in a fabrication facility. In practice, the implanter 10 can be slightly mispositioned. Use of an adjustable spacer 110 allows repositioning of the pod door openers 70 to a desired degree of accuracy so that the conveyor can accurately place the pods by means of the locating pins 113. In the exemplary embodiment of the invention the front surface 112 can be moved back and forth in the "y" direction (See co-ordinate system of FIG. 2) a distance of between ¼ and ½ inches.

As seen in FIG. 7, the hole patterns 162, 164, 166 also include two side openings 180, 182 to accommodate two setscrews 184, which pass through the thickness of the weldment. The two openings 180a, 182a of the spacer blocks 150, 152 are threaded so that the set screws can be rotated with respect to the weldment and moved in an out by means of a hex opening at an exposed end of the screw 184. An opposite end of the setscrew 184 extends through the weldment and faces the ion implanter end station. This exposed end of the setscrew abuts the frame members (60a, 60b, 60c for example) and defines a position of the front surface 112 of the weldment in relation to the ion implanter. By rotating the setscrews 184 the position of the front surface 112 can be adjusted. The set screw 184 extends beyond a thickness T of the weldment a distance D which is adjustable over a range of approximately one quarter to one half inches. At one extreme, the setscrew is fully seated in the weldment so that an end of the setscrew is spaced a maximum from a rear surface 186 of the weldment. At an opposite extreme of its adjustment range the end of the screw 184 is co-planar (or flush) with the rear surface 186.

During set up of the ion implanter, once the ion implanter end station has been fixed, the position of the pod door openers are adjusted by adjustment of the set screws that about the frame members 60a, 60b, 60c until the locating pins 113 are within the tolerances expected by the overhead conveyor. The spacer member 110 is then secured to the end station by means of the connectors 172 passing through the openings 170. These connectors 172 are longer than the setscrews and threadingly engage openings of the frame to securely fix the spacer weldment to the frame members 60.

In an exemplary embodiment of the present invention, the setscrews are ¼ inch hex head set screws having a length of ⅝ inch. Two of these setscrews are located at the top, middle and bottom of each of the uprights of the weldment. Other patterns and size adjustment members are possible. Although the invention has been described in conjunction with an ion implanter, other workpiece fabrication tools used in integrated circuit fabrication could benefit from use of the invention.

It is appreciated therefore that although the invention has been described with a degree of particularity, it is the intent that the invention include all modifications and alterations from the disclosed design falling within the spirit or scope of the appended claims.

What is claimed is:

1. A method for positioning a movable workpiece support with respect an integrated circuit fabrication tool comprising:

Positioning a tool for receipt of one or more workpieces for performing a fabrication step on the workpiece;

Mounting a robotic arm in relation to a treatment region of said tool for moving a workpiece in relation to the treatment region;

Coupling a spacer having an exposed spacer surface to the tool;

Adjusting a positioning of the exposed spacer surface toward or away from the tool in a direction generally perpendicular with respect to the exposed spacer surface; and Positioning one or more workpieces into range of the robotic arm by moving a movable workpiece support against the exposed spacer surface and placing one or more workpieces on the support in relation to the ion implanter within reach of the robotic arm.

2. The method of claim 1 wherein one or more workpieces are supported within a cassette that contains multiple workpieces.

3. The method of claim 1 wherein the step of positioning the workpieces is performed by sensing a position of a locating pin and placing the cassette onto the movable workpiece support based on the sensing of said pin.

4. The method of claim 1 wherein the spacer is a weldment having a thickness and having an outer surface that defines the exposed spacer surface and including adjusting the position of the outer surface with respect to the tool by adjusting a set screw having one end that engages a surface of said tool.

5. The process of claim 4 wherein the workpiece support is attached to the tool after adjusting the set screw by abutting the workpiece support against the outer surface of said weldment.

6. The process of claim 5 wherein subsequent to abutting the workpiece support against the outer surface, the workpiece support is fixed in place by connectors that engage the spacer.

7. The process of claim 6 wherein the workpiece support comprises a pod door opening and additionally comprising a step of movably supporting a cassette containing parallel oriented workpieces for movement within reach of the robot.

8. The process of claim 1 additionally wherein the robotic arm delivers the workpieces to a load lock for reducing the pressure experienced by the workpieces within the tool.

9. Apparatus comprising:

An integrated circuit fabrication tool having a treatment region for placement of workpieces for treatment of said workpieces;

A robotic arm mounted in relation to the fabrication tool for moving workpieces to the treatment region of said tool;

A spacer coupled to the integrated circuit fabrication tool and having an exposed spacer surface moveable toward or away from the fabrication tool in a direction generally perpendicular to said spacer surface for adjustable movement with respect to the tool so that the position of the exposed spacer surface can be adjusted; and A workpiece support for placement in abutting relationship with the exposed spacer surface to position a workpiece within reach of the robot.

10. The apparatus of claim 9 wherein the spacer comprises a weldment having spacer blocks that define a thickness of said weldment.

11. The apparatus of claim 9 wherein the spacer comprises:
   a) One or more spacer blocks having threaded openings that extend through said one or more spacer blocks;
   b) A frame member that supports the spacer blocks;
   c) One or more spacer locating screws that engage the threaded openings of the spacer blocks and extend outwardly an adjustable distance from a surface of the spacer to position the spacer in relation to the fabrication tool by contact with a fabrication tool; and
   d) One or more connectors that attach the spacer to the fabrication tool once the position of the spacer in relation to the fabrication tool has been fixed by adjustment of said locating screws.

12. The apparatus of claim 9 wherein the spacer comprises:
   a) One or more spacer blocks having threaded openings that extend through said one or more spacer blocks;
   b) A frame member to which the spacer blocks are welded to fix the spacer blocks and wherein the combination of the spacer blocks and the frame member defines a weldment having a weldment thickness;
   c) One or more spacer locating screws that engage the threaded openings of the spacer blocks and extend outwardly an adjustable distance from a surface of the weldment to position the weldment by contact with a fabrication tool; and
   d) One or more connectors that attach the spacer to the fabrication tool once the position of the weldment in relation to the fabrication tool has been fixed by adjustment of said locating screws.

13. The apparatus of claim 9 wherein the workpiece support comprises a pod door opener having a movable support that supports cassettes containing multiple workpieces for movement in relation to the tool.

14. A spacer for use in positioning one or more workpieces with respect to an integrated circuit fabrication tool comprising:
   a) One or more spacer blocks having openings that extend through said one or more spacer blocks;
   b) A frame that supports the spacer blocks;
   c) One or more locating adjusting screws that are positioned within the openings of the spacer blocks and extend outwardly an adjustable distance from a surface of the spacer to position the spacer in relation to a fabrication tool by contact between said pins and the fabrication tool; and
   d) One or more connectors for attaching the spacer to a fabrication tool once the position of the spacer in relation to the fabrication tool has been fixed by adjustment of said locating adjusting screws.

15. Apparatus for use in positioning one or more workpieces with respect to an integrated circuit fabrication tool comprising:
   a) One or more spacer blocks having threaded openings that extend through said one or more spacer blocks;
   b) A frame member to whom the spacer blocks are welded to fix the spacer blocks and wherein the combination of the spacer blocks and the frame member defines a weldment having a weldment thickness;
   c) One or more spacer locating screws that engage the threaded openings of the spacer blocks and extend outwardly an adjustable distance from a surface of the weldment to position the weldment by contact with a fabrication tool; and
   d) One or more connectors for attaching the spacer to a fabrication tool once the position of the weldment in relation to the fabrication tool has been fixed by adjustment of said locating screws.

16. Apparatus comprising:
   an integrated circuit fabrication tool having a treatment region for placement of workpieces for treatment of said workpieces;
   a robotic arm mounted in relation to the fabrication tool for moving workpieces to the treatment region of said tool;
   a spacer having an exposed spacer surface for adjustable movement with respect to the tool so that the position of the exposed spacer surface can be adjusted, said spacer comprising:
   a) one or more spacer blocks having threaded openings that extend through said one or more spacer blocks;
   b) a frame member that supports the spacer blocks;
   c) one or more spacer locating screws that engage the threaded openings of the spacer blocks and extend outwardly an adjustable distance from a surface of the spacer to position the spacer in relation to the fabrication tool by contact with a fabrication tool; and
   d) one or more connectors that attach the spacer to a fabrication tool once the position of the spacer in relation to the fabrication tool has been fixed by adjustment of said locating screws; and a workpiece support for placement in abutting relationship with the exposed spacer surface to position a workpiece within reach of the robot.

* * * * *